US012740293B2

(12) United States Patent
Lee

(10) Patent No.: US 12,740,293 B2
(45) Date of Patent: Sep. 15, 2026

(54) DISPLAY DEVICE

(71) Applicant: LG Display Co., Ltd., Seoul (KR)

(72) Inventor: JongHwae Lee, Seongnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 430 days.

(21) Appl. No.: 18/407,106

(22) Filed: Jan. 8, 2024

(65) Prior Publication Data

US 2024/0260401 A1 Aug. 1, 2024

(30) Foreign Application Priority Data

Feb. 1, 2023 (KR) ........................ 10-2023-0013743

(51) Int. Cl.

*H10K 59/80* (2023.01)
*G09F 9/33* (2006.01)
*H10K 50/84* (2023.01)
*H10K 50/842* (2023.01)
*H10K 50/844* (2023.01)
*H10K 59/12* (2023.01)
*H10K 59/124* (2023.01)
*H10K 71/00* (2023.01)

(52) U.S. Cl.

CPC .................................. *H10K 59/873* (2023.02)

(58) Field of Classification Search

CPC .. H10K 59/873; H10K 59/12; H10K 59/8722; H10K 59/872; H10K 50/8426; H10K 50/844; G09F 9/335

See application file for complete search history.

(56) References Cited

U.S. PATENT DOCUMENTS

2022/0209176 A1* 6/2022 Cha .................... H10K 50/8426
2023/0200143 A1* 6/2023 Park .................... H10K 59/122 257/40
2023/0200176 A1* 6/2023 Lee ........................ H10K 59/38 257/40
2024/0122031 A1* 4/2024 Shin .................... H10K 59/873
2024/0130199 A1* 4/2024 Kim .................. H10K 59/1201
2025/0214433 A1* 7/2025 Son ........................ B60K 35/25

FOREIGN PATENT DOCUMENTS

KR 10-2018-0062143 A 6/2018

* cited by examiner

*Primary Examiner* — Mohsen Ahmadi

(74) *Attorney, Agent, or Firm* — Birch, Stewart, Kolasch & Birch, LLP

(57) ABSTRACT

Discussed is a display device including a substrate having a display area, and a non-display area adjacent to the display area, an encapsulation substrate disposed on the substrate, and a plurality of dams disposed between the substrate and the encapsulation substrate. The plurality of dams includes a first dam disposed in the non-display area and including an epoxy-based resin, and a second dam disposed outside the first dam and including a urethane-based resin. The first dam and the second dam minimize a penetration of outside moisture and oxygen into the display device in a state in which a bonding force is increased.

19 Claims, 9 Drawing Sheets

DISPLAY DEVICE

CROSS-REFERENCE TO RELATED APPLICATIONS

This application claims priority to Korean Patent Application No. 10-2023-0013743 filed on Feb. 1, 2023, in the Korean Intellectual Property Office, the entire disclosure of which is hereby expressly incorporated by reference into the present application.

BACKGROUND

Field

The present disclosure relates to a display device, and more particularly, to a display device that improves lifespan and reliability by minimizing penetration of moisture and oxygen.

Discussion of the Related Art

Recently, various display devices capable of visually displaying information are being rapidly developed with increased need for providing rapid access to information. Various studies are being continuously conducted to develop a variety of display devices which are thin and lightweight, consume low power, and have improved performance.

As representative display devices, there are a liquid crystal display (LCD) device, an electrowetting display (EWD) device, an organic light-emitting display (OLED) device, and the like.

Among the display devices, an organic light-emitting display device refers to a display device that can provide light without aid of a separate light emitting unit. Unlike a liquid crystal display apparatus, the organic light-emitting display device does not require a separate light source and thus can be manufactured as a lightweight, thin display device. In addition, the organic light-emitting display devices are attracting attention as next-generation display devices not only because the organic light-emitting display device operates at a low voltage and thus is advantageous in terms of power consumption, but also because the organic light-emitting display device is excellent in implementation of colors, response speeds, viewing angles, and contrast ratios (CRs).

However, the organic light-emitting display device has a problem in that an organic layer, which constitutes a light-emitting element, is very vulnerable to heat, moisture, oxygen, and the like. Accordingly, studies have been conducted on encapsulation technologies that can inhibit moisture and oxygen from penetrating into the organic light-emitting display device in order to obtain improved reliability and a longer device life.

SUMMARY OF THE DISCLOSURE

An object to be achieved by the present disclosure is to provide a display device that suppresses moisture penetration and increases a bonding force between upper and lower substrates.

Another object to be achieved by the present disclosure is to provide a display device that additionally minimizes penetration of oxygen from the outside.

Still another object to be achieved by the present disclosure is to provide a display device having a reduced non-display area that is a bezel area.

Yet another object to be achieved by the present disclosure is to provide a display device that improves precision of dam application.

Objects of the present disclosure are not limited to the above-mentioned objects, and other objects, which are not mentioned above, can be clearly understood by those skilled in the art from the following descriptions.

According to an aspect of the present disclosure, the display device includes a substrate including a display area, and a non-display area configured to surround the display area, an encapsulation substrate disposed on the substrate, a bonding film disposed between the substrate and the encapsulation substrate and a plurality of dams disposed between the substrate and the encapsulation substrate and configured to surround the bonding film, in which the plurality of dams can include a first dam disposed adjacent to the display area and made of epoxy-based resin and a second dam disposed outside the first dam and made of urethane-based resin.

Other detailed matters of the exemplary embodiments are included in the detailed description and the drawings.

According to the present disclosure, the first dam for suppressing the moisture penetration is provided inward, and the second dam for increasing the bonding force between the upper and lower substrates is provided outward, which can improve the ability to block moisture and increase the bonding force in comparison with the related art.

According to the present disclosure, the first dam for suppressing the moisture penetration is provided inward, the third dam for blocking oxygen is provided outward, and the second dam for increasing the bonding force between the upper and lower substrates is provided between the first dam and the third dam, which can minimize the penetration of outside moisture and oxygen into the display device in the state in which the bonding force is increased.

According to the present disclosure, the dam and the alignment key for the scribing process are disposed to overlap each other, and the scribing process is performed on the dam, such that process tolerance at the lateral side of the display device can be removed. As described above, it is possible to reduce the bezel width by decreasing the non-display area by removing process tolerance at the lateral side of the display device.

According to the present disclosure, the electrode pattern is provided, along the dam, on the upper or lower substrate on which the dam is applied, and the electric field is applied between the nozzle and the electrode pattern, which can improve the precision of the application of the dam and improve the material and process margin.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTIONS OF THE EMBODIMENTS

Figure 1:
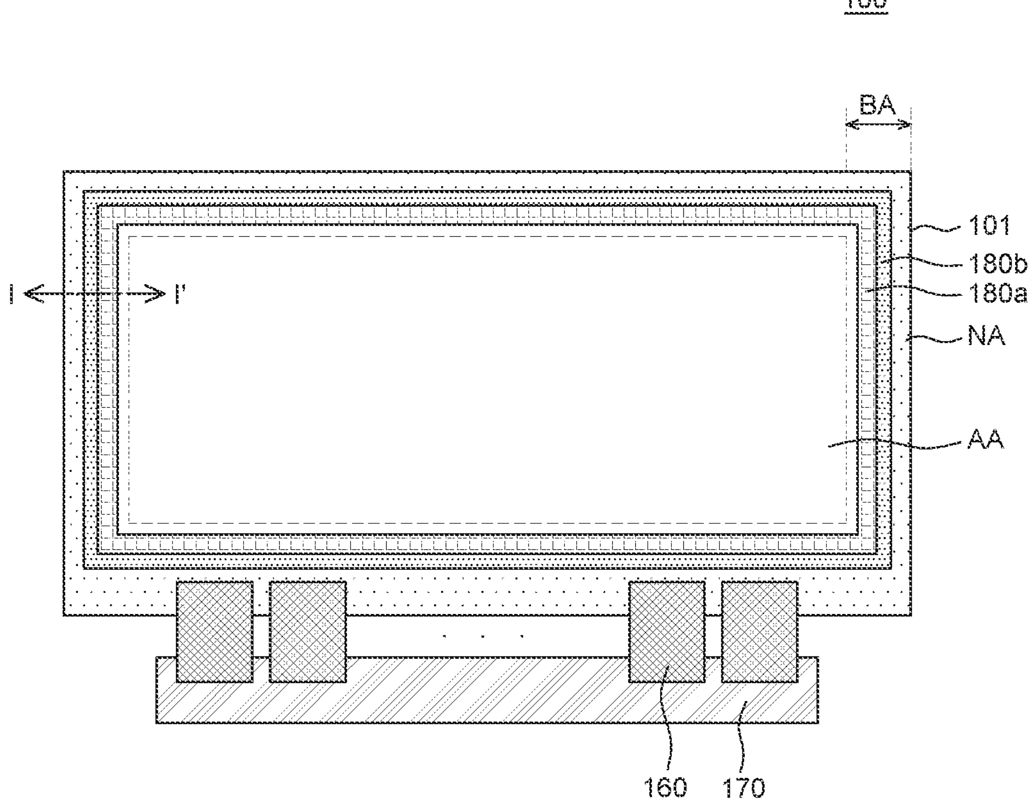
FIG. 1 is a top plan view of a display device according to a first embodiment of the present disclosure.

Advantages and characteristics of the present disclosure and a method of achieving the advantages and characteristics will be clear and apparent by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to accompanying drawings.

FIG. 1 is a top plan view of a display device according to a first embodiment of the present disclosure.

With reference to FIG. 1, a display device 100 of a first embodiment of the present disclosure can include a substrate 101, an encapsulation substrate 140, a plurality of flexible films 160, a printed circuit board 170, and a dam 180. All components of each display device according to all embodiments of the present disclosure are operatively coupled and configured.

The substrate 101 can be referred to as a lower substrate, and the encapsulation substrate 140 can be referred to as an upper substrate. However, the present disclosure is not limited thereto.

The substrate 101 is a support member for supporting the other constituent elements of the display device 100.

For example, the substrate 101 can include a display element configured to display images, a driving element configured to operate the display element, and lines configured to transmit various types of signals to the display element and the driving element. Different display elements can be defined depending on the types of display devices 100. For example, in case that the display device 100 is an organic light-emitting display device, the display element can be an organic light-emitting element including an anode, an organic layer, and a cathode. For example, in case that the display device 100 is a liquid crystal display device, the display element can be a liquid crystal display element. Hereinafter, it is assumed that the display device 100 is an organic light-emitting display device. However, the display device 100 is not limited to the organic light-emitting display device, and other types of light-emitting display device, such as a micro-LED display device is within the scope of the embodiments of the present disclosure.

The substrate 101 can include a display area AA and a non-display area NA.

The display area AA is an area of the display device 100 in which images are displayed.

The display area AA can include a plurality of subpixels configured to constitute a plurality of pixels, and a circuit configured to operate the plurality of subpixels. The plurality of subpixels are minimum units that constitute the display area AA. The display element can be disposed in each of the plurality of subpixels. The plurality of subpixels can constitute the pixel. For example, the plurality of subpixels can each include the light-emitting element including the anode, the organic layer, and the cathode. However, the present disclosure is not limited thereto. In addition, the circuit configured to operate the plurality of subpixels can include driving elements, lines, and the like. For example, the circuit can include a thin-film transistor, a storage capacitor, a gate line, a data line, and the like. However, the present disclosure is not limited thereto.

The non-display area NA can have a predetermined bezel width BA that is an area in which no image is displayed.

FIG. 1 illustrates that the non-display area NA surrounds the display area AA having a quadrangular shape. However, the shapes and arrangements of the display area AA and the non-display area NA are not limited to the example illustrated in FIG. 1.

In other words, the display area AA and the non-display area NA can be suitable for a design of an electronic device equipped with the display device 100. For example, an exemplary shape of the display area AA can also be a pentagonal shape, a hexagonal shape, a circular shape, an elliptical shape, or the like. But embodiments of the present disclosure are not limited thereto.

Various lines and circuits for operating the organic light-emitting element in the display area AA can be disposed in the non-display area NA. For example, the non-display area NA can include link lines for transmitting signals to the plurality of subpixels and the circuit in the display area AA. The non-display area NA can include a drive IC such as a gate driver IC and a data driver IC and include a pad part and the like. However, the present disclosure is not limited thereto.

The display device 100 can include various additional elements configured to generate various signals or operate the pixel in the display area AA. The additional elements for operating the pixel can include an inverter circuit, a multiplexer, an electrostatic discharge (ESD) circuit, and the like. The display device 100 can also include additional elements related to functions other than the function of operating the pixel. For example, the display device 100 can include additional elements that provide a touch detection function, a user certification function (e.g., fingerprint recognition), a multi-level pressure detection function, a tactile feedback function, and the like. The above-mentioned additional elements can be positioned in the non-display area NA and/or an external circuit connected to a connection interface. But embodiments of the present disclosure are not limited thereto.

The pad part can be disposed to receive signals from the outside. The pad part can be disposed in the non-display area NA of the display device 100 and electrically connected to the printed circuit board 170 and various lines and circuits disposed in the display area AA. For example, the pad part can serve to transmit signals to the gate line and the data line. The pad part can be configured as a gate pad for transmitting a gate signal to the gate line. Alternatively, the pad part can be configured as a data pad for transmitting a data signal to the data line. However, the present disclosure is not limited thereto.

The flexible film 160 is a film having various types of components disposed on a base film having flexibility. For example, the flexible film 160 can be a film for supplying signals to the plurality of subpixels and the circuit in the display area AA. The flexible film 160 can be electrically connected to the substrate 101. The flexible film 160 can be disposed at one end of the non-display area NA of the substrate 101 and supply power voltages, data voltages, and the like to the plurality of subpixels and the circuit in the display area AA. The number of flexible films 160 can be variously changed in accordance with design. However, the present disclosure is not limited thereto.

For example, the drive IC such as the gate driver IC and the data driver IC can be disposed on the flexible film 160. The drive IC is a component configured to process data for displaying the image and process a driving signal for processing the data. The drive IC can be disposed in ways such as a chip-on-glass (COG) method, a chip-on-film (COF) method, and a tape carrier package (TCP) method depending on how the drive IC is mounted.

The printed circuit board 170 can be disposed at one end of the flexible film 160 and connected to the flexible film 160. The printed circuit board 170 is a component for supplying a signal to the drive IC. The printed circuit board 170 can supply various signals, such as driving signals and data signals, to the drive IC. For example, a data drive part configured to generate data signals can be mounted on the printed circuit board 170. The generated data signals can be supplied to the plurality of subpixels and the circuit of the substrate 101 through the flexible film 160. The number of printed circuit boards 170 can be variously changed in accordance with design. However, the present disclosure is not limited thereto.

Meanwhile, the display device 100 according to the first embodiment of the present disclosure can include the dam 180 provided in the non-display area NA to ensure structural reliability of the display device 100 while suppressing moisture penetration into the interior of the display device 100.

For example, the dam 180 can include a first dam **180*a* disposed adjacent to the display area AA, and a second dam 180*b* disposed outside the first dam 180*a* and configured to surround the first dam 180*a*. According to the first embodiment of the present disclosure, the first dam 180*a* for suppressing moisture penetration is provided inward, and the second dam 180*b* for increasing a bonding force between the substrate 101 and the encapsulation substrate is provided outward, which can improve the ability to block moisture and increase the bonding force in comparison with the related art. The first dam 180*a* and the second dam 180*b* will be described in detail with reference to FIGS. 2 and 3**.

Figure 2:
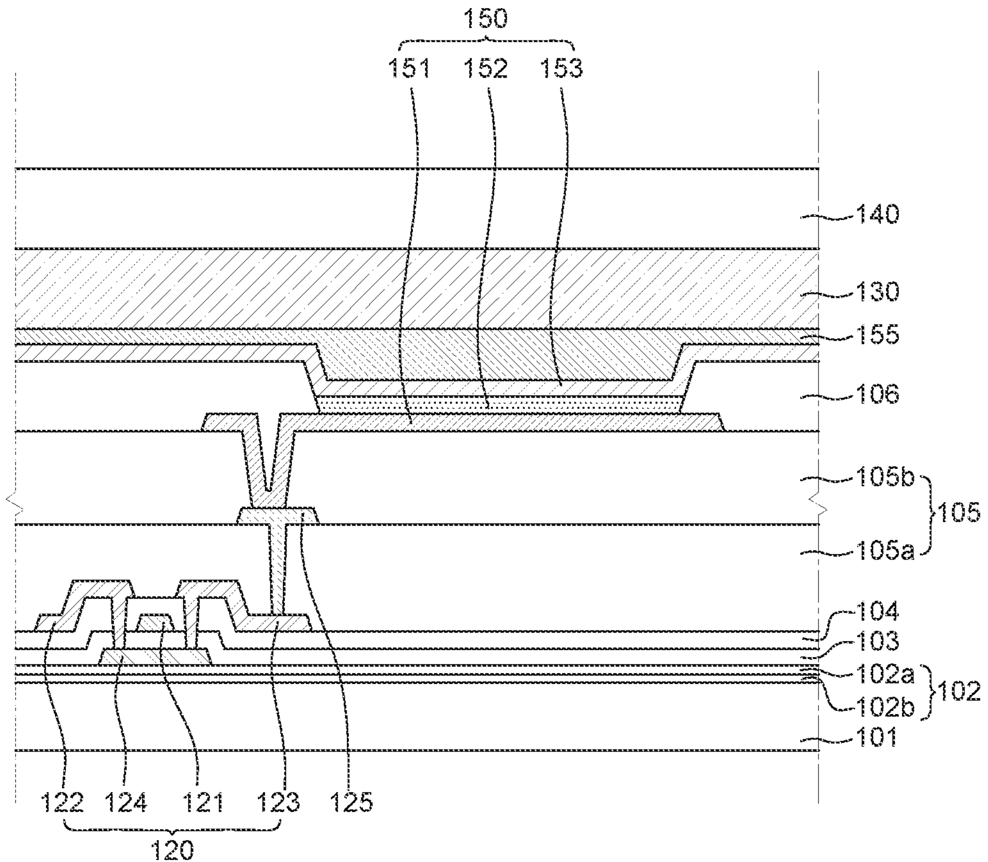
FIG. 2 is a cross-sectional view of a subpixel of the display device in FIG. 1.

FIG. 2 is a cross-sectional view of the subpixel of the display device in FIG. 1.

Figure 3:
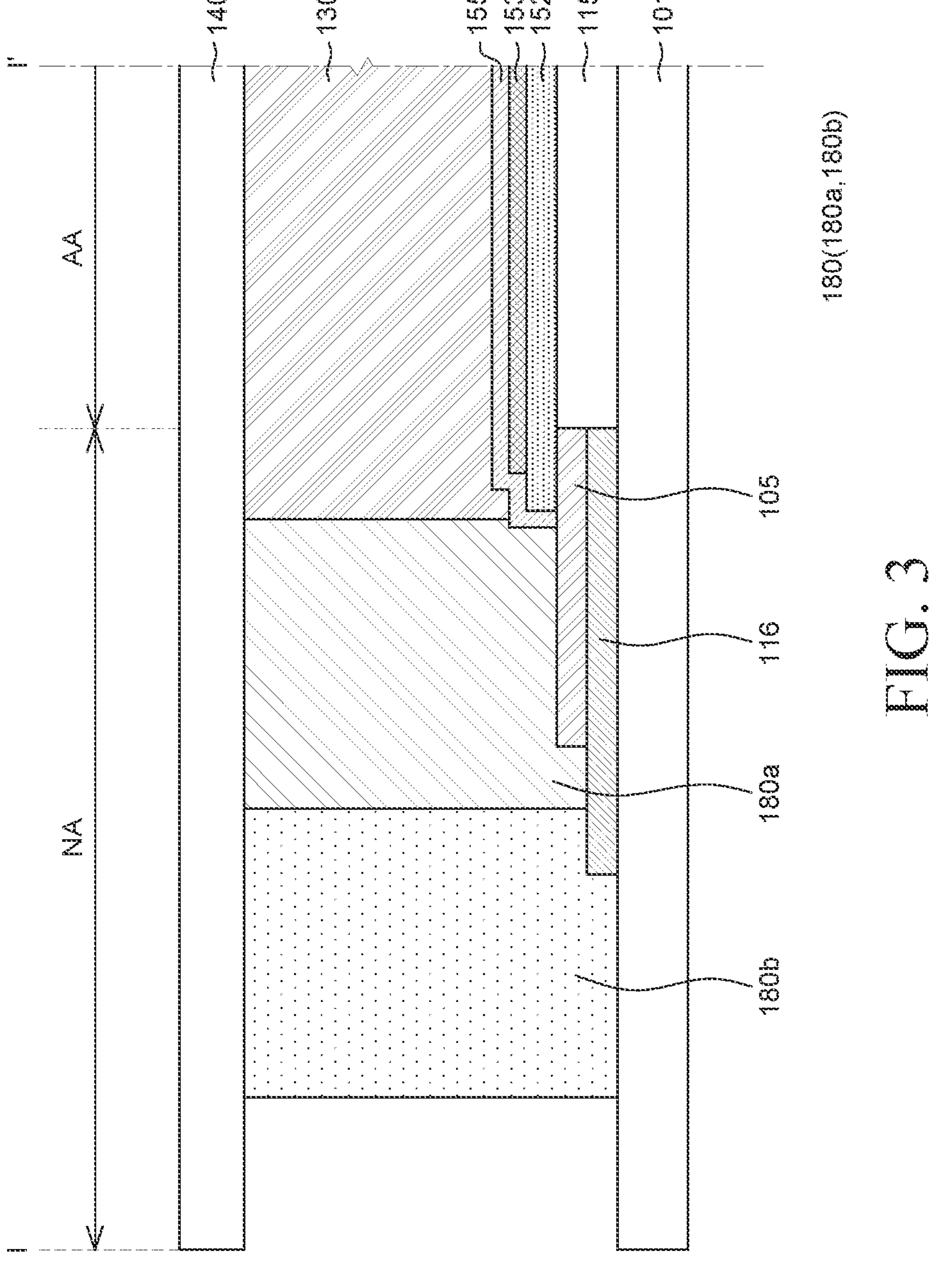
FIG. 3 is a cross-sectional view of the display device taken along line I-I' in FIG. 1.

FIG. 3 is a cross-sectional view of the display device taken along line I-I' in FIG. 1.

For convenience of description, FIG. 3 schematically illustrates a pixel part 115 in the display area AA and a gate-in-panel (GIP) part 116 in the non-display area NA. The pixel part 115 and the GIP part 116 can include various types of components disposed below an organic layer 152.

With reference to FIGS. 2 and 3, a driving element 120 can be disposed on an upper portion of the substrate 101.

Further, a planarization layer 105 can be disposed on an upper portion of the driving element 120.

In addition, an organic light-emitting element 150 can be disposed on an upper portion of the planarization layer 105 and electrically connected to the driving element 120.

A bonding film 130 and an encapsulation substrate 140 can be sequentially disposed on an upper portion of the organic light-emitting element 150. However, the display device according to the first embodiment of the present disclosure is not limited to the above-mentioned layered structure.

The substrate 101 can be a glass or plastic substrate. In case that the substrate is a plastic substrate, a polyimide-based material or a polycarbonate-based material can be used, such that the substrate can have flexibility. In particular, polyimide is widely used for the plastic substrate because polyimide is a material that can be applied to a high-temperature process and used for coating.

A buffer layer 102 can be disposed on the upper portion of the substrate 101.

The buffer layer 102 is a layer for protecting various types of electrodes and lines from impurities such as alkaline ions leaking from the substrate 101 or lower layers. The buffer layer 102 can have a multilayer structure including a first buffer layer **102*a* and a second buffer layer 102*b*. However, the present disclosure is not limited thereto. The buffer layer 102** can be made of silicon oxide (SiOx) or silicon nitride (SiNx) or configured as a multilayer including silicon oxide (SiOx) or silicon nitride (SiNx). But embodiments of the present disclosure are not limited thereto.

The buffer layer 102 can delay or prevent the diffusion of moisture and/or oxygen that has penetrated into the substrate 101. In addition, the buffer layer 102 can include a multi-buffer and/or an active buffer. For example, the active buffer can serve to protect an active layer 124 of the driving element 120, and the active layer 124 can be made of or include a semiconductor. The active buffer can serve to block various types of defects introduced from the substrate 101. The active buffer can be made of or include amorphous silicon (a-Si) or the like.

The driving element 120 can be configured as a thin-film transistor. For example, the driving element 120 can include a gate electrode 121, a source electrode 122, a drain electrode 123, and the active layer 124. In addition, the driving element 120 can be electrically connected to the organic light-emitting element 150 through a connection electrode 125 and transmit an electric current or signal to the organic light-emitting element 150.

The active layer 124 can be disposed on the buffer layer 102. The active layer 124 can be made of or include polysilicon (p-Si). In this case, a predetermined area of the active layer 124 can be doped with impurities. In addition, the active layer 124 can be made of amorphous silicon (a-Si) or an organic semiconductor material such as pentacene. In addition, the active layer 124 can be made of an oxide semiconductor.

A gate insulation layer 103 can be disposed on the active layer 124. For example, the gate insulation layer 103 can be made of or include an insulating inorganic material such as silicon oxide (SiOx) or silicon nitride (SiNx). In addition, the gate insulation layer 103 can be made of or include an insulating organic material or the like. But embodiments of the present disclosure are not limited thereto.

The gate electrode 121 can be disposed on the gate insulation layer 103. The gate electrode 121 can be made of various electrically conductive materials, for example, magnesium (Mg), aluminum (Al), nickel (Ni), chromium (Cr), molybdenum (Mo), tungsten (W), gold (Au), or an alloy thereof. But embodiments of the present disclosure are not limited thereto.

An interlayer insulation layer 104 can be disposed on the gate electrode 121. For example, the interlayer insulation layer 104 can be made of an insulating material such as silicon oxide (SiOx) or silicon nitride (SiNx). In addition, the interlayer insulation layer 104 can be made of an insulating organic material. But embodiments of the present disclosure are not limited thereto.

A contact hole, through which source and drain areas are exposed, can be formed by selectively removing the gate insulation layer 103 and the interlayer insulation layer 104. The source electrode 122 and the drain electrode 123 can be disposed on the interlayer insulation layer 104. The source electrode 122 and the drain electrode 123 can each have a single-layer or multilayer structure which can be made of a material for an electrode. As necessary or desired, an additional protective layer (passivation layer) made of or including an inorganic insulating material can be disposed to cover the source electrode 122 and the drain electrode 123. But embodiments of the present disclosure are not limited thereto.

The planarization layer 105 can be disposed on the upper portion of the driving element 120 configured as described above.

Meanwhile, as described above, the substrate 101 can include the display area AA configured to provide images to a user, and the non-display area NA that is a peripheral area of the display area AA.

The GIP part 116 can be disposed in the non-display area NA of the substrate 101.

The drive circuit for operating the display device can include a gate drive circuit configured to sequentially supply gate pulses (or scan pulses) to a plurality of gate lines in the display area AA, a data drive circuit configured to supply data voltages to a plurality of data lines in the display area AA, and a timing controller configured to supply image data and various types of control signals to the gate drive circuit and the data drive circuit.

The gate drive circuit can be configured as at least one gate drive IC. However, the gate drive circuit can be simultaneously formed in the non-display area NA of the substrate 101 during a process of forming a plurality of signal lines (the gate lines and the data lines) and the subpixel. The present disclosure described above can adopt a gate-in-panel (GIP) method that integrates the gate drive circuit into the non-display area NA of the substrate 101.

To this end, for example, various types of elements (transistors and capacitors), which constitute the GIP of the gate drive circuit, can be disposed on the GIP part 116.

The planarization layer 105 can be disposed on an upper portion of the GIP part 116 configured as described above.

The planarization layer 105 can extend to the non-display area NA so as to cover a part of the GIP part 116. However, the present disclosure is not limited thereto.

The planarization layer 105 can be an overcoat layer. However, the present disclosure is not limited thereto.

The planarization layer 105 can have a multilayer structure including at least two layers. For example, the planarization layer 105 can include a first planarization layer 105*a* and a second planarization layer 105*b*. The first planarization layer 105*a* can be disposed to cover the driving element 120 and disposed so that the source electrode 122 and the drain electrode 123 of the driving element 120 are partially exposed.

In this case, for example, the connection electrode 125 can be disposed on the first planarization layer 105*a* and electrically connect the driving element 120 and the organic light-emitting element 150. In addition, in FIG. 2, various metal layers can be disposed on the first planarization layer 105*a* and serve as electrodes and electric wires such as data lines or signal lines.

In addition, the second planarization layer 105*b* can be disposed on an upper portion of the first planarization layer 105*a* and an upper portion of the connection electrode 125. The configuration in which the planarization layer 105 of the first embodiment of the present disclosure is provided as two layers is based on the fact that the number of various types of signal lines increases as the display device has high resolution. The additional layer is provided because it is difficult to dispose all the lines on a single layer while ensuring minimum intervals. The addition of the additional layer (e.g., the second planarization layer 105*b*) can provide a margin for disposing lines, which further facilitates the disposition design of lines/electrodes. In addition, in case that a dielectric material is used for the planarization layer 105 having a multilayer structure, the planarization layer 105 can serve to create capacitance between metal layers.

For example, the second planarization layer 105*b* can be formed such that a part of the connection electrode 125 is exposed. The drain electrode 123 of the driving element 120 and an anode 151 of the organic light-emitting element 150 can be electrically connected by the connection electrode 125.

The organic light-emitting element 150 can be configured by sequentially disposing the anode 151, a plurality of organic layers 152, and a cathode 153.

For example, the organic light-emitting element 150 can include the anode 151 disposed on the planarization layer 105, the organic layer 152 disposed on the anode 151, and the cathode 153 disposed on the organic layer 152.

Meanwhile, the display device can be implemented as a top emission type or a bottom emission type. In the case of the top emission type, a reflective layer made of an opaque conductive material with high reflectance, for example, silver (Ag), aluminum (Al), gold (Au), molybdenum (Mo), tungsten (W), chromium (Cr), or an alloy thereof can be additionally disposed on a lower portion of the anode 151 so that light, which is emitted from the organic layer 152, is reflected by the anode 151 and propagates upward, i.e., in a direction toward the cathode 153 at the upper side. But embodiments of the present disclosure are not limited thereto. In contrast, in the case of the bottom emission type, the anode 151 can be made of only a transparent electrically conductive material such as indium tin oxide (ITO), indium zinc oxide (IZO), or indium gallium zinc oxide (IGZO). But embodiments of the present disclosure are not limited thereto. Hereinafter, the description will be made on the assumption that the display device of the present disclosure is the top emission type.

A bank 106 can be provided on the planarization layer 105 and disposed in the remaining area excluding the light-emitting area. For example, the bank 106 has a bank hole through which the anode 151 corresponding to the light-emitting area is exposed. The bank 106 can be made of an inorganic insulating material such as silicon nitride (SiNx) or silicon oxide (SiOx) or made of an organic insulating material such as BCB, acrylic resin, or imide-based resin. But embodiments of the present disclosure are not limited thereto.

The bank 106 can extend to the non-display area NA.

The organic layer 152 can be disposed on the anode 151 exposed by the bank 106. The organic layer 152 can include a light-emitting layer, an electron injection layer, an electron transport layer, a hole transport layer, a hole injection layer, and the like. But embodiments of the present disclosure are not limited thereto.

The organic layer 152 can extend to the non-display area NA.

In the non-display area NA, the organic layer 152 can be disposed on the planarization layer 105.

The organic layer 152 can be disposed to be spaced apart from an end of the planarization layer 105 at a predetermined distance. However, the present disclosure is not limited thereto.

The cathode 153 can be disposed on the organic layer 152.

In the case of the top emission type, the cathode 153 can include a transparent electrically conductive material. For example, the cathode 153 can be made of indium tin oxide (ITO), indium zinc oxide (IZO), indium gallium zinc oxide (IGZO), or the like. In the case of the bottom emission type, the cathode 153 can include any one selected from a group consisting of metallic materials such as gold (Au), silver (Ag), aluminum (Al), molybdenum (Mo), magnesium (Mg), palladium (Pd), and copper (Cu) or an alloy thereof. Alternatively, the cathode 153 can be configured by stacking a layer made of a transparent electrically conductive material such as indium tin oxide (ITO), indium zinc oxide (IZO), or indium gallium zinc oxide (IGZO) and a layer made of metallic materials such as gold (Au), silver (Ag) aluminum (Al), molybdenum (Mo), magnesium (Mg), palladium (Pd), and copper (Cu) or an alloy thereof. However, the present disclosure is not limited thereto.

The cathode 153 can extend to the non-display area NA.

In the non-display area NA, the cathode 153 can be disposed on the organic layer 152.

The cathode 153 can be disposed to be spaced apart from an end of the organic layer 152 at a predetermined distance. However, the present disclosure is not limited thereto.

A capping layer 155 can be disposed on the cathode 153. The capping layer 155 can be made of a material with a large refractive index and a high optical absorption rate to reduce irregular reflection of external light.

The capping layer 155 can extend to the non-display area NA.

The capping layer 155 can be disposed to cover the cathode 153 and the organic layer 152.

The bonding film 130 and the encapsulation substrate 140 can be disposed on the capping layer 155.

For example, the bonding film 130, together with the encapsulation substrate 140, can protect the organic light-emitting element 150 of the pixel part 115 from outside moisture, oxygen, impact, and the like. The bonding film 130 can further include a moisture absorbent. The moisture absorbent can include particles having hygroscopicity. The moisture absorbent can absorb moisture, oxygen, and the like from the outside, thereby minimizing a degree to which moisture and oxygen penetrate into the pixel part 115. However, the present disclosure is not limited thereto.

The bonding film 130 can include a filler. For example, the filler can be made of a transparent material so that brightness does not deteriorate while light emitted from the organic light-emitting element 150 passes through the encapsulation substrate 140.

For example, the filler can be made of epoxy or olefin and include talc, calcium oxide (CaO), barium oxide (BaO), zeolite (zeolite), silicon oxide (SiO), and the like. But embodiments of the present disclosure are not limited thereto.

The encapsulation substrate 140 can be disposed on the bonding film 130.

For example, the encapsulation substrate 140, together with the bonding film 130, can protect the organic light-emitting element 150 of the pixel part 115. The encapsulation substrate 140 can protect the organic light-emitting element 150 from outside moisture, oxygen, impact, and the like. The encapsulation substrate 140 can be disposed on the upper portion of the substrate 101 so that the pad part disposed at one side of the substrate 101 is exposed.

Meanwhile, the dam 180 can be provided at an edge of the substrate 101 disposed between the substrate 101 and the encapsulation substrate 140.

The dam 180 can be disposed in the non-display area NA at an outer periphery of the display area AA. For example, the dam 180 can be formed to surround the pixel part 115 and the bonding film 130 in a plan view. The dam 180, together with the bonding film 130, can join and seal the substrate 101 and the encapsulation substrate 140.

Therefore, the dam 180 can be disposed in an area in which the substrate 101 and the encapsulation substrate 140 overlap each other.

For example, the dam 180 can partially overlap the GIP part 116.

In addition, for example, the dam 180 can partially overlap the capping layer 155.

The dam 180 can include the first dam **180*a* and the second dam 180*b***.

The first dam 180*a* can be disposed to surround the display area AA. For example, the first dam 180*a* can be disposed in the non-display area NA and provided adjacent to the display area AA.

The second dam 180*b* can be disposed outside the first dam 180*a* and surround the first dam 180*a* and the display area AA. For example, the second dam 180*b* can be disposed outside the non-display area NA.

A side surface of the first dam 180*a* can contact a side surface of the second dam 180*b*.

The characteristics of the organic layer 152 of the organic light-emitting element 150 are rapidly degraded in case that the organic layer 152 is exposed to moisture or oxygen. Therefore, it is important to seal the organic light-emitting element 150 from an external environment to suppress the degradation of the organic light-emitting element 150 caused by the penetration of moisture or oxygen.

According to the technology that uses the dam 180 as in the present disclosure among various encapsulation technologies, the dam 180 can serve to delay the penetration of moisture or block the penetration of moisture from the side surface of the dam 180.

The dam 180 of the first embodiment of the present disclosure may not only serve to block the penetration of outside moisture, but also serve to increase the bonding force between the substrate 101 and the encapsulation substrate 140.

To this end, the dam 180 of the first embodiment of the present disclosure can include the first dam 180*a* provided inward and configured to suppress the moisture penetration, and the second dam 180*b* provided outward and configured to increase the bonding force between the substrate 101 and the encapsulation substrate 140.

In the related art, a dam for suppressing moisture penetration has low bonding characteristics, and a dam excellent in bonding characteristics has low moisture penetration suppressing characteristics. In the first embodiment of the present disclosure, the moisture penetration suppressing characteristics and the bonding characteristics can be individually and respectively provided to the first dam 180*a* and the second dam 180*b*, thereby improving the ability to block moisture and increasing the bonding force in comparison with the related art.

For example, the first dam 180*a* can be made of resin capable of suppressing the moisture penetration, and the second dam 180*b* can be made of resin capable of improving the bonding characteristics.

For example, the first dam 180*a* uses epoxy-based resin as a base material and contains a moisture-absorbing material. But embodiments of the present disclosure are not limited thereto.

The moisture-absorbing material can be a liquid getter. For example, the moisture-absorbing material can be a calcium oxide getter. If a size of the moisture-absorbing material is too small, a moisture-absorbing rate can decrease. If a size of the moisture-absorbing material is too large, a volume is expanded by moisture absorption, which can cause separation of the substrate. For example, the moisture-absorbing material can be made of an alkali metal oxide, silica, porous zeolite, an organic moisture absorbent, an inorganic moisture absorbent, or other materials. But embodiments of the present disclosure are not limited thereto.

In the first embodiment of the present disclosure, the first dam 180*a* can only serve to block the moisture penetration, thereby increasing a getter content and thus improving the ability to block moisture.

In addition, for example, the second dam 180*b* can use urethane-based resin, as a base material, which is excellent in bonding characteristics. The second dam 180*b* may not contain the moisture-absorbing material.

In the first embodiment of the present disclosure, the second dam 180*b* can be made only of the base material excellent in bonding characteristics without containing the moisture-absorbing material such as the getter, thereby improving the bonding force in comparison with the related art.

Meanwhile, the element performance is degraded in case that the organic layer of the organic light-emitting element is exposed to oxygen as well as moisture. Therefore, in the present disclosure, the dam for blocking oxygen can be additionally provided to minimize the penetration of outside moisture and oxygen into the display device in the state in which the bonding force is improved. This configuration will be described in detail with reference to the drawings.

Figure 4:
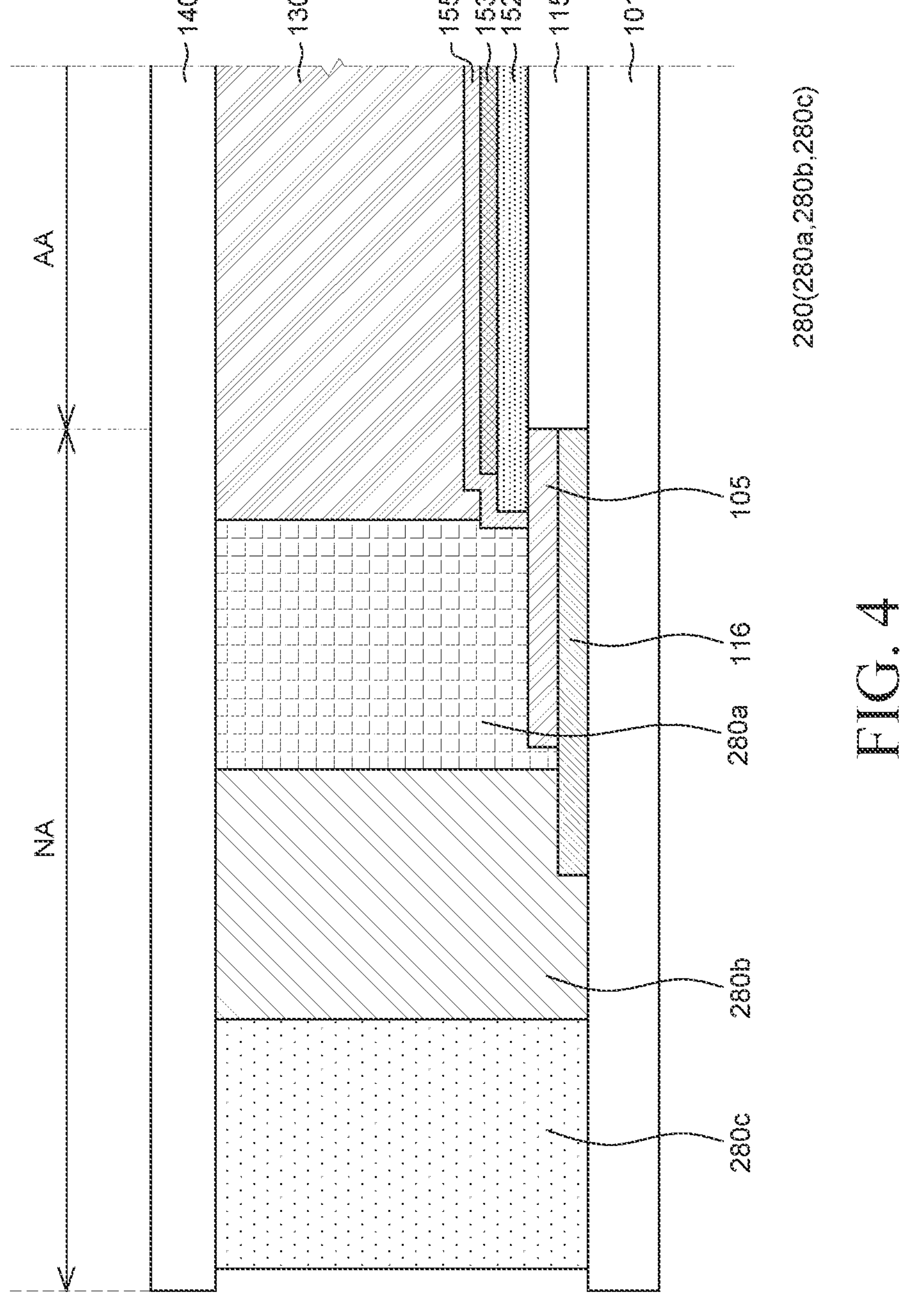
FIG. 4 is a cross-sectional view of a display device according to a second embodiment of the present disclosure.

FIG. 4 is a cross-sectional view of a display device according to a second embodiment of the present disclosure.

The display device according to the second embodiment of the present disclosure in FIG. 4 is substantially identical in configuration to the display device according to the first embodiment of the present disclosure in FIGS. 1 to 3, except for a configuration of a dam 280. Therefore, repeated descriptions of the identical components will be omitted. The same reference numerals are used for the same components. Hereinafter, the components denoted by the same reference numerals will be described with reference to FIGS. 1 to 3.

For convenience of description, FIG. 4 schematically illustrates the pixel part 115 in the display area AA and the GIP part 116 in the non-display area NA. The pixel part 115 and the GIP part 116 can include various types of components disposed below the organic layer 152.

With reference to FIG. 4, the driving element 120 can be disposed on the upper portion of the substrate 101.

Further, the planarization layer 105 can be disposed on the upper portion of the driving element 120.

In addition, the organic light-emitting element 150 can be disposed on the upper portion of the planarization layer 105 and electrically connected to the driving element 120.

The bonding film 130 and the encapsulation substrate 140 can be sequentially disposed on the upper portion of the organic light-emitting element 150. However, the display device according to the second embodiment of the present disclosure is not limited to the above-mentioned layered structure.

The planarization layer 105 can extend to the non-display area NA so as to cover a part of the GIP part 116. However, the present disclosure is not limited thereto.

The organic light-emitting element 150 can be configured by sequentially disposing the anode 151, the plurality of organic layers 152, and the cathode 153.

The organic layer 152 can extend to the non-display area NA.

In the non-display area NA, the organic layer 152 can be disposed on the planarization layer 105.

The organic layer 152 can be disposed to be spaced apart from the end of the planarization layer 105 at a predetermined distance. However, the present disclosure is not limited thereto. The cathode 153 can be disposed on the organic layer 152.

The cathode 153 can extend to the non-display area NA.

In the non-display area NA, the cathode 153 can be disposed on the organic layer 152.

The cathode 153 can be disposed to be spaced apart from the end of the organic layer 152 at a predetermined distance. However, the present disclosure is not limited thereto.

The capping layer 155 can be disposed on the cathode 153.

The capping layer 155 can extend to the non-display area NA.

The capping layer 155 can be disposed to cover the cathode 153 and the organic layer 152.

Meanwhile, the dam 280 can be provided at the edge of the substrate 101 disposed between the substrate 101 and the encapsulation substrate 140.

The dam 280 can be disposed in the non-display area NA at the outer periphery of the display area AA. For example, the dam 280 can be formed to surround the pixel part 115 and the bonding film 130 in a plan view. The dam 280, together with the bonding film 130, can join and seal the substrate 101 and the encapsulation substrate 140.

Therefore, the dam 280 can be disposed in the area in which the substrate 101 and the encapsulation substrate 140 overlap each other.

For example, the dam 280 can partially overlap the GIP part 116.

In addition, for example, the dam 280 can partially overlap the capping layer 155.

The dam 280 can include a first dam 280*a*, a second dam 280*b*, and a third dam 280*c*.

The first dam 280*a* can be disposed to surround the display area AA. For example, the first dam 280*a* can be disposed in the non-display area NA and provided adjacent to the display area AA.

For example, the first dam 280*a* can partially overlap the capping layer 155 and the planarization layer 105. In addition, the first dam 280*a* can be disposed on an upper portion of the GIP part 116 and overlap the GIP part 116.

The second dam 280*b* can be disposed outside the first dam 280*a* and surround the first dam 280*a* and the display area AA.

For example, the second dam 280*b* can partially overlap the GIP part 116.

A side surface of the first dam 280*a* can contact a side surface of the second dam 280*b*.

The third dam 280*c* can be disposed outside the second dam 280*b* and surround the first dam 280*a*, the second dam 280*b*, and the display area AA. For example, the third dam 280*c* can be disposed outside the non-display area NA.

For example, the third dam 280*c* may not overlap the capping layer 155, the planarization layer 105, and the GIP part 116.

The dam 280 of the second embodiment of the present disclosure may not only serve to block the penetration of outside moisture and increase the bonding force between the substrate 101 and the encapsulation substrate 140, but also serve to block the penetration of oxygen.

To this end, the dam 280 of the second embodiment of the present disclosure can include the first dam 280*a* provided inward and configured to suppress moisture penetration, the third dam 280*c* provided outward and configured to block oxygen, and the second dam 280*b* provided between the first dam 280*a* and the third dam 280*c* and configured to increase the bonding force between the upper and lower substrates, i.e., the substrate 101 and the encapsulation substrate 140.

According to the second embodiment of the present disclosure described above, the third dam 280*c* disposed at the outermost periphery can be exposed to the outside and block oxygen first. The resin of each of the dams 280 has a function of suppressing moisture penetration, such that all the dams 280 can suppress the moisture penetration. The first dam 280*a* disposed at the innermost side can finally and maximally suppress the moisture penetration by using the getter. The second dam 280*b* can be disposed between the first dam 280*a* and the third dam 280*c* to increase the bonding force.

For example, the first dam 280*a* can be made of resin capable of suppressing the moisture penetration, the second dam 280*b* can be made of resin capable of improving the bonding characteristics, and the third dam 280*c* can be made of resin capable of blocking the penetration of oxygen.

For example, the first dam 280*a* uses epoxy-based resin as a base material and contains a moisture-absorbing material.

The moisture-absorbing material can be a liquid getter. For example, the moisture-absorbing material can be a calcium oxide getter. If a size of the moisture-absorbing material is too small, a moisture-absorbing rate can decrease. If a size of the moisture-absorbing material is too large, a volume is expanded by moisture absorption, which can cause separation of the substrate. For example, the moisture-absorbing material can be made of an alkali metal oxide, silica, porous zeolite, an organic moisture absorbent, an inorganic moisture absorbent, or other materials. But embodiments of the present disclosure are not limited thereto.

In the second embodiment of the present disclosure, the first dam 280*a* can only serve to block the moisture penetration, thereby increasing a getter content and thus improving the ability to block moisture.

In addition, for example, the second dam 280*b* can use urethane-based resin, as a base material, which is excellent in bonding characteristics. The second dam 280*b* need not contain the moisture-absorbing material.

In the second embodiment of the present disclosure, the second dam 280*b* can be made only of the base material excellent in bonding characteristics without containing the moisture-absorbing material such as the getter, thereby improving the bonding force in comparison with the related art.

In addition, for example, the third dam 280*c* can include a crosslinker that is contained in polar polymer, such as acrylic, to improve film density.

Therefore, in the second embodiment of the present disclosure, the third dam 280*c* made of polar polymer having a high degree of cross-linking is disposed outside the non-display area NA, which makes it possible to minimize the penetration of outside moisture and oxygen into the display device in the state in which the bonding force is increased.

However, the present disclosure is not limited to the above-mentioned arrangement order of the dam 280, and various arrangement orders can be implemented. For example, the dam 280 of the second embodiment of the present disclosure can include a first dam provided inward and configured to block oxygen, a third dam provided outward and configured to suppress moisture penetration, and a second dam provided between the first and second dams and configured to increase a bonding force between the upper and lower substrates, i.e., the substrate 101 and the encapsulation substrate 140. In this case, it is possible to more effectively block oxygen. In addition, for example, the dam 280 according to the second embodiment of the present disclosure can include a first dam provided inward and configured to increase a bonding force, a third dam provided outward and configured to block oxygen, and a second dam provided between the first dam and the third dam and configured to suppress moisture penetration. In this case, it is possible to more effectively increase the bonding force. In various embodiments of the present disclosure, the dam 280 can include a plurality of first, second and third dams that are repeatedly stacked in repeating units. When provided as repeated stacks, each of the first, second and third dam can be thin layers, each having a width such as one tenth to one hundredth of a width of the bezel area. Also, in various embodiments of the present disclosure, a total width of the plurality of dams can be approximately equal to a width of a bezel area or the non-display area of the display device.

Meanwhile, in the present disclosure, the dam and an alignment key for a scribing process are disposed to overlap each other, and the scribing process is performed on the dam, such that process tolerance at a lateral side of the display device can be removed. This configuration will be described in detail with reference to the drawings.

Figure 5:
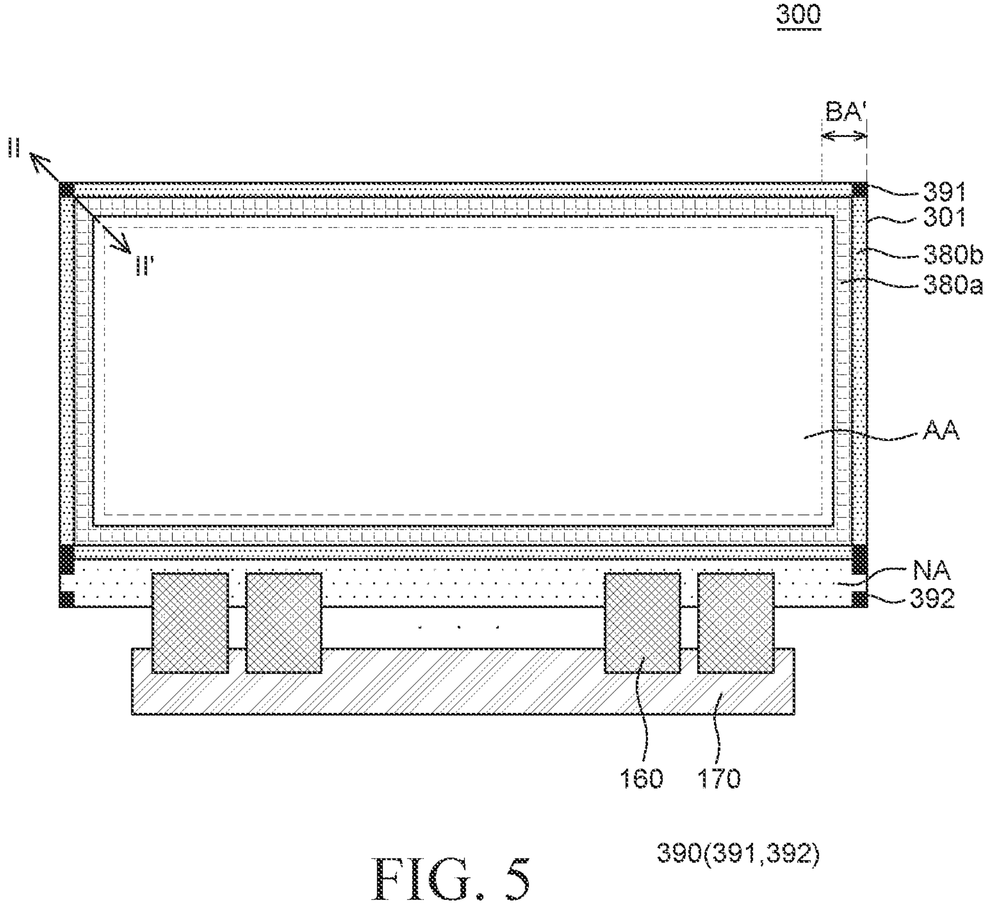
FIG. 5 is a top plan view of a display device according to a third embodiment of the present disclosure.

FIG. 5 is a top plan view of a display device according to a third embodiment of the present disclosure.

Figure 6:
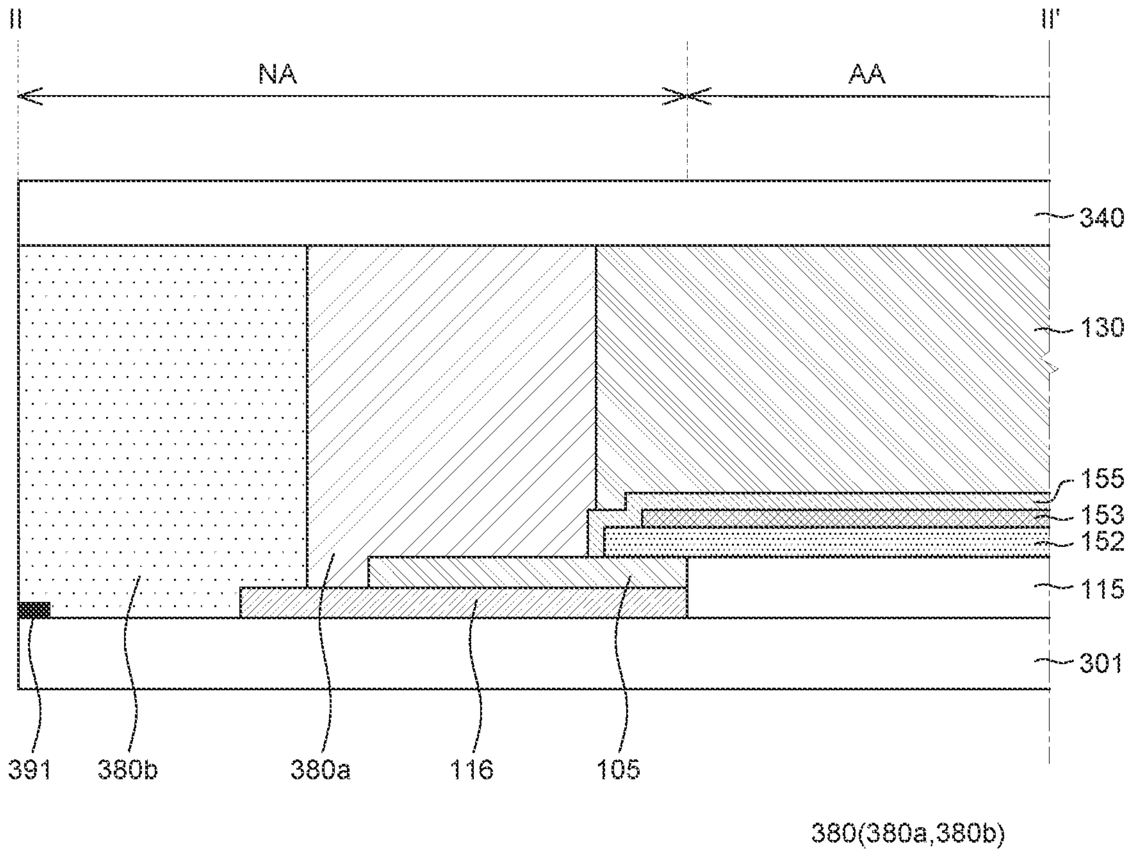
FIG. 6 is a cross-sectional view of the display device taken along line II-II' in FIG. 5.

FIG. 6 is a cross-sectional view of the display device taken along line II-II' in FIG. 5.

A display device 300 according to a third embodiment of the present disclosure in FIGS. 5 and 6 is substantially identical in configuration to the display device 100 according to the first embodiment of the present disclosure in FIGS. 1 to 3, except for configurations of a dam 380 and alignment keys 390. Therefore, repeated descriptions of the identical components will be omitted. The same reference numerals are used for the same components. Hereinafter, the components denoted by the same reference numerals will be described with reference to FIGS. 1 to 3.

For convenience of description, FIG. 6 schematically illustrates the pixel part 115 in the display area AA and the GIP part 116 in the non-display area NA. The pixel part 115 and the GIP part 116 can include various types of components disposed below the organic layer 152.

With reference to FIGS. 5 and 6, the display device 300 of the third embodiment of the present disclosure can include a substrate 301, an encapsulation substrate 340, the plurality of flexible films 160, the printed circuit board 170, and the dam 380. But embodiments of the present disclosure are not limited thereto.

The substrate 301 can include a display area AA and a non-display area NA. The non-display area NA can have a predetermined bezel width BA' that is an area in which no image is displayed.

The driving element 120 can be disposed on an upper portion of the substrate 301.

Further, the planarization layer 105 can be disposed on the upper portion of the driving element 120.

In addition, the organic light-emitting element 150 can be disposed on the upper portion of the planarization layer 105 and electrically connected to the driving element 120.

The bonding film 130 and the encapsulation substrate 340 can be sequentially disposed on the upper portion of the organic light-emitting element 150. However, the display device according to the third embodiment of the present disclosure is not limited to the above-mentioned layered structure.

The display device 300 according to the third embodiment of the present disclosure can include the dam 380 provided in the non-display area NA to ensure the reliability while suppressing moisture penetration.

For example, the dam 380 can include a first dam **380*a* disposed adjacent to the display area AA, and a second dam 380*b* disposed outside the first dam 380*a* and configured to surround the first dam 380*a*. As substantially in the above-mentioned first embodiment, in the third embodiment of the present disclosure, the first dam 380*a* for suppressing the moisture penetration is provided inward, and the second dam 380*b* for increasing the bonding force between the substrate 301 and the encapsulation substrate 340 is provided outward, which can improve the ability to block moisture and increase the bonding force in comparison with the related art. However, the present disclosure is not limited thereto. A third dam can be further disposed outside the second dam 380*b* and surround the first dam 380*a*, the second dam 380*b***, and the display area AA. For example, the third dam can be disposed outside the non-display area NA.

The first dam **380*a* can be disposed to surround the display area AA. For example, the first dam 380*a*** can be disposed in the non-display area NA and provided adjacent to the display area AA.

For example, the first dam **380*a* can partially overlap the capping layer 155 and the planarization layer 105. In addition, the first dam 380*a* can be disposed on the upper portion of the GIP part 116 and overlap the GIP part 116**.

The second dam **380*b* can be disposed outside the first dam 380*a* and surround the first dam 380*a*** and the display area AA.

For example, the second dam **380*b* can partially overlap the GIP part 116**.

A side surface of the first dam **380*a* can contact a side surface of the second dam 380*b***.

For example, the first dam **380*a* can be made of resin capable of suppressing the moisture penetration, the second dam 380*b*** can be made of resin capable of improving the bonding characteristics, and the third dam can be made of resin capable of blocking the penetration of oxygen.

Meanwhile, in the third embodiment of the present disclosure, the alignment key 390 can be provided on the substrate 301 and disposed in the non-display area NA. The alignment key 390 refers to a key for accurately aligning the substrate 301 and the encapsulation substrate 340 during the scribing process. The alignment key 390 can be made of the same material as a conductive constituent element formed on the upper portion of the substrate 301. For example, the alignment key 390 can be made of the same material as a constituent element such as a thin-film transistor, a capacitor, a line, or the like disposed on the upper portion of the substrate 301. However, the present disclosure is not limited thereto. The alignment key 390 can be disposed at the edge of the display device 300.

The alignment keys 390 can include first alignment keys 391 and second alignment keys 392. However, the present disclosure is not limited thereto.

The first alignment key 391 can be disposed between the substrate 301 and the dam 380. The first alignment key 391 can be disposed to overlap the dam 380. For example, the first alignment key 391 can be disposed between the substrate 301 and the second dam **380*b* so as to overlap the second dam 380*b*. Therefore, a bottom surface of the first alignment key 391 can contact the substrate 301, and a top surface of the first alignment key 391 can contact a bottom surface of the second dam 380*b*. The first alignment key 391 can be disposed at the corner of the display device 300. Specifically, the first alignment key 391 can be disposed at the corner of the encapsulation substrate 340**.

A side surface of the first alignment key 391 and a side surface of the dam 380 can be disposed on the same plane. For example, the side surface of the first alignment key 391 can be disposed on the same plane as a side surface of the substrate 301, a side surface of the encapsulation substrate 340, and the side surface of the second dam **380*b*. The side surface of the substrate 301, the side surface of the encapsulation substrate 340, the side surface of the second dam 380***b*, and the side surface of the first alignment key 391 can be disposed on the same plane by the same process, e.g., the same scribing process. For example, the side surface of the substrate 301, the side surface of the encapsulation substrate 340, the side surface of the second dam 380*b*, and the side surface of the first alignment key 391 can be disposed on the same plane as components disposed in an area excluding the display device 300 are removed during a process of dividing a mother substrate into the display devices 300.

For example, the first alignment key 391 can be exposed to a side surface of the display device 300 together with the substrate 301, the encapsulation substrate 340, and the second dam 380*b*. In this case, the configuration in which the components are disposed on the same plane can mean that side surfaces of two or more components, which overlap one another, are just scribed when viewed from above.

The second alignment key 392 can be disposed to indicate a position at which the mother substrate is scribed for each of the display device 300. Therefore, for example, the second alignment key 392 can be disposed at a lower corner of the substrate 301 that does not overlap the encapsulation substrate 340. For example, the second alignment key 392 can be disposed at a lower end of the display device 300 during the process of separating the component disposed outside the display device 300 on the mother substrate. The second alignment key 392 can be disposed at the corner of the display device 300 by the scribing process. In this case, a side surface of the second alignment key 392 can be disposed on the same plane as the side surface of the substrate 301. However, the present disclosure is not limited thereto.

Meanwhile, FIG. 5 illustrates two second alignment keys 392 and four first alignment keys 391. However, the number of alignment keys 390 is not limited thereto.

As described above, the characteristics of the organic layer of the organic light-emitting element are rapidly degraded in case that the organic layer is exposed to moisture or oxygen. Therefore, it is important to use the encapsulation technology for sealing the organic light-emitting element from an external environment in order to suppress the degradation of the organic light-emitting element caused by the penetration of moisture and oxygen.

According to the technology that uses the dam among various encapsulation technologies, the dam serves to delay the penetration of moisture or block the penetration of moisture from the side surface of the dam 180. The moisture penetration inhibition performance of the dam can be determined depending on a material of the dam and a width of the dam. Among methods of improving the moisture penetration inhibition performance of the dam, it is important to increase the width of the dam to improve the moisture penetration inhibition performance of the dam during the process of manufacturing the display device. However, there is a limitation in reducing the width of the dam to reduce a size of the non-display area. In addition, the dam is typically manufactured by applying a material through a dispenser process. The dispenser process controls the application amount by using pneumatic pressure, which makes it difficult to precisely control the application amount. Therefore, it is necessary to necessarily consider a process margin.

Meanwhile, during the current process of manufacturing the display device, the alignment key, which is used to scribe the mother substrate, is disposed outside the dam. Therefore, in the final display device on which the scribing process has been completely performed, the alignment key, the substrate, and the encapsulation substrate remain at the lateral side of the dam. In addition, a significantly large area remains in consideration of process tolerance related to the scribing process to be performed on the lateral side of the dam.

Therefore, in the display device 300 of the third embodiment of the present disclosure, the dam 380 is disposed to overlap the first alignment key 391 for the scribing process, and the scribing process is performed on the upper portion of the dam 380, such that the non-display area NA can be reduced. For example, the second dam 380*b* and the first alignment key 391 are positioned to overlap each other in a state in which the dam 380 is formed to have a width larger than a width of the dam 380 required to suppress the moisture penetration and improve the bonding characteristics. Thereafter, in case that the scribing process is performed by using the first alignment key 391 that overlaps the second dam 380*b*, the side surface of the second dam 380*b* and the side surface of the first alignment key 391 are partially removed during the scribing process, and the side surface of the encapsulation substrate 340, the side surface of the first alignment key 391, the side surface of the second dam 380*b*, and the side surface of the substrate 301 are disposed on the same plane. Therefore, in the display device 300 according to the third embodiment of the present disclosure, the encapsulation substrate, the substrate, and the first alignment key, which are disposed at the lateral side of the dam 380, are removed, such that the non-display area extending to the lateral side of the dam 380 can be reduced, which can reduce the overall width and area of the non-display area NA. Therefore, the bezel width BA' is more remarkably reduced than the bezel width BA in the first embodiment.

In addition, the moisture penetration inhibition performance of the display device 300 according to the third embodiment of the present disclosure may not be degraded even when the non-display area NA is reduced. As described above, the first dam 380*a* required to suppress the moisture penetration is disposed inward, and the second dam 380*b* required to increase the bonding force is provided outward. Therefore, the width of the first dam 380*a* for maintaining the moisture penetration inhibition performance is maintained even when the non-display area NA of the display device 300 according to the third embodiment of the present disclosure is reduced. Therefore, it is possible to ensure the reliability while suppressing the moisture penetration.

Meanwhile, in the present disclosure described above, a third dam for blocking oxygen can be additionally provided in addition to the first dam 380*a* and the second dam 380*b*. In this case, it is possible to minimize the penetration of outside moisture and oxygen into the display device 300 in the state in which the bonding force is increased. In addition, in this case, the first alignment key 391 can be disposed between the substrate 301 and the third dam and overlap the third dam, for example. Therefore, the bottom surface the first alignment key 391 can contact the substrate 301, and the top surface of the first alignment key 391 can contact the bottom surface of the third dam. In addition, for example, the side surface of the first alignment key 391 can be disposed on the same plane as the side surface of the substrate 301, the side surface of the encapsulation substrate 340, and the side surface of the third dam.

In addition, for example, the third dam can be disposed outside the second dam 380*b* and surround the first dam 380*a*, the second dam 380*b*, and the display area AA. For example, the third dam can be disposed outside the non-display area NA.

The third dam need not overlap the capping layer 155, the planarization layer 105, and the GIP part 116.

For example, the third dam can be made of resin that blocks the penetration of oxygen.

That is, for example, the third dam can include a cross-linker that is contained in polar polymer, such as acrylic, to improve film density.

Meanwhile, according to the present disclosure, a dam-forming material can be applied onto an electrode by using an electric field in order to form a precise dam without a thickness deviation. This configuration will be described in detail with reference to the drawings.

Figure 7:
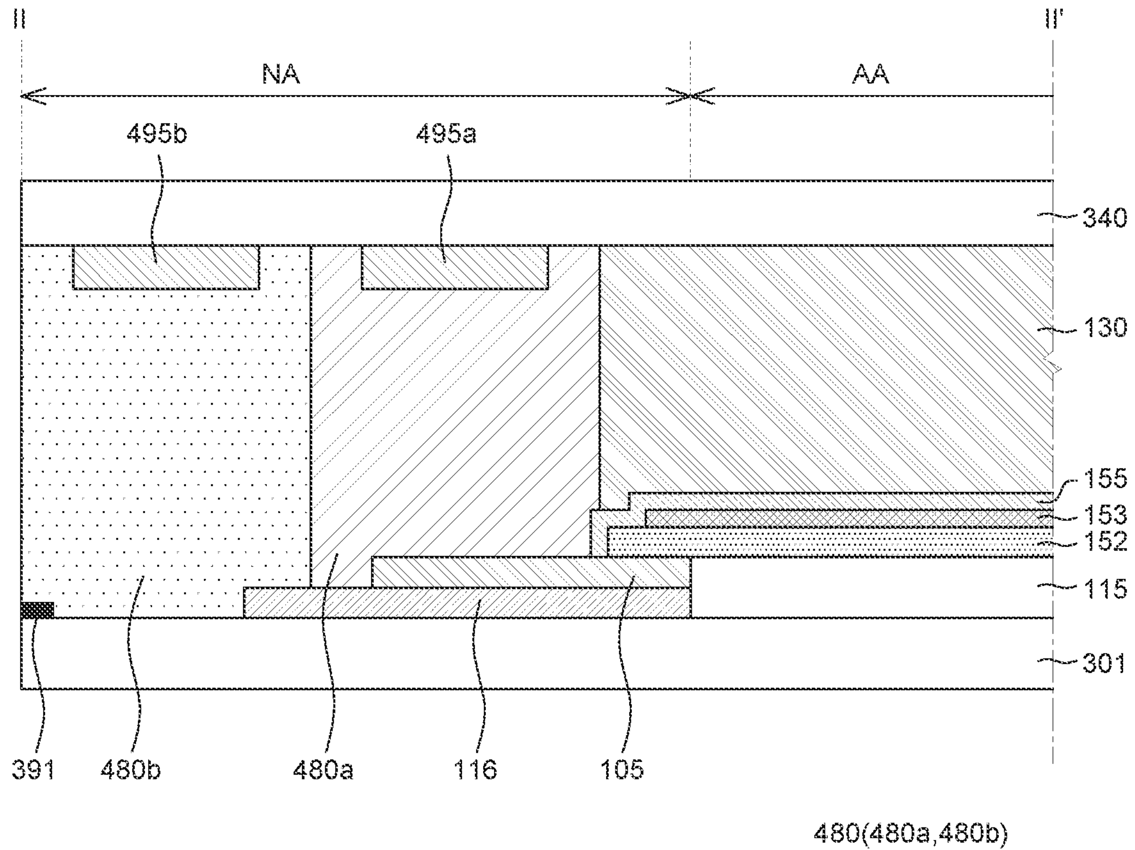
FIG. 7 is a cross-sectional view of a display device according to a fourth embodiment of the present disclosure.

FIG. 7 is a cross-sectional view of a display device according to a fourth embodiment of the present disclosure.

The display device according to the fourth embodiment of the present disclosure in FIG. 7 is substantially identical in configuration to the display device 300 of the third embodiment of the present disclosure in FIGS. 5 to 6, except for configurations of a dam 480 and electrode patterns 495*a* and 495*b*. Therefore, repeated descriptions of the identical components will be omitted. The same reference numerals are used for the same components. Hereinafter, the components denoted by the same reference numerals will be described with reference to FIGS. 5 to 6.

With reference to FIG. 7, the dam 480 can include a first dam 480*a* and a second dam 480*b*.

The first dam 480*a* can be disposed between the display area AA and the second dam 480*b*. For example, the first dam 480*a* can be disposed to surround the display area AA.

The first dam 480*a* can be made of a material containing a material having a higher bonding force than a material of the second dam 480*b*.

For example, the second dam 480*b* can be disposed to surround the first dam 480*a*.

Because the second dam 480*b* is disposed at the outermost periphery of the display device, the second dam 480*b* can be made of a material containing a material higher in moisture penetration inhibition characteristics than the material of the first dam 480*a*.

As substantially discussed in the above-mentioned first and third embodiments, in the fourth embodiment of the present disclosure, for example, the first dam 480*a* for suppressing the moisture penetration is provided inward, and the second dam 480*b* for increasing the bonding force between the substrate 301 and the encapsulation substrate 340 is provided outward, which can improve the ability to block moisture and increase the bonding force in comparison with the related art. However, the present disclosure is not limited thereto. A third dam can be further disposed outside the second dam 480*b* and surround the first dam 480*a*, the second dam 480*b*, and the display area AA. For example, the third dam can be disposed outside the non-display area NA.

In addition, at the upper, left, and right edges of the display device, the second dam 480*b* can be positioned on the same plane as the side surface of the substrate 301 and the side surface of the encapsulation substrate 340. This is because a scribing line is disposed on the second dam 480*b* along the upper, left, and right edges of the display device that defines a unit cell on the mother substrate.

The electrodes 495*a* and 495*b* can be disposed on the bottom surface of the encapsulation substrate 340. The electrodes 495*a* and 495*b* can include a first electrode 495*a* and a second electrode 495*b*.

For example, the first electrode 495*a* can be an electrode for forming the first dam 480*a* and be disposed to overlap the first dam 480*a*.

In addition, the second electrode 495*b* can be an electrode for forming the second dam 480*b* and be disposed to overlap the second dam 480*b*.

Meanwhile, the plurality of display devices can be disposed on the large-area mother substrate while defining unit cells. In this case, pads for applying voltages to the first electrode 495*a* and the second electrode 495*b* can be provided on the mother substrate, and the first electrode 495*a* and the second electrode 495*b* connected to the pads can be partially removed by the scribing process. In this case, a side surface of the first electrode 495*a* and a side surface of the second electrode 495*b* can be exposed by the scribing process. For example, at one side of the substrate 301, one end of the first electrode 495*a* and one end of the second electrode 495*b* can be exposed.

In addition, the first electrode 495*a* and the second electrode 495*b* can alternately operate at the time of forming the first dam 480*a* and the second dam 480*b*.

The electrodes 495*a* and 495*b*, which receive (+) voltages, are disposed on the encapsulation substrate 340 of the display device by means of the pads formed on the mother substrate, and then the electrodes 495*a* and 495*b* are grounded so that a (−) voltage is applied to an electric field application nozzle for forming an electric field on the dam-forming material discharged onto the electrodes 495*a* and 495*b*. Therefore, the dam-forming material in the electric field application nozzle can be discharged onto the electrodes 495*a* and 495*b* to form the dam 480. In this case, the dam 480 can be a dam-forming object made before the scribing process is performed, and the dam-forming object can have a width larger than a width of the dam 480 made after the scribing process is performed. Thereafter, when the scribing process is performed on the mother substrate along a scribing line formed to overlap the dam 480, the pads for applying the (+) voltages to the electrodes 495*a* and 495*b* are removed, only the electrodes 495*a* and 495*b*, i.e., the lines, which receive the (+) voltages, remain on the encapsulation substrate 340, and a part of the dam-forming object made before the scribing process is removed, such that the dam 480, which is coincident with the side surface of the substrate 301 and the side surface of the encapsulation substrate 340, can be formed.

Therefore, in the display device according to the fourth embodiment of the present disclosure, a width of the dam 480, which is disposed at the upper, right, and left sides of the display device that overlap the scribing line, can be different from a width of the dam 480 disposed at the lower side of the display device that does not overlap the scribing line. More specifically, the width of the dam 480 disposed at the upper, right, and left sides of the display device can be smaller than the width of the dam 480 disposed at the lower side of the display device.

Because the (−) voltage is applied to the electric field application nozzle at the time of forming the first dam 480*a*, the (+) voltage can be applied to the first electrode 495*a*, and the (−) voltage can be applied to the second electrode 495*b*, such that the dam-forming material can be discharged only onto the first electrode 495*a*, and the first dam 480*a* can be formed.

Because the (−) voltage is applied to the electric field application nozzle at the time of forming the second dam 480*b*, the (−) voltage can be applied to the first electrode 495*a*, and the (+) voltage can be applied to the second electrode 495*b*, such that the dam-forming material can be discharged only onto the second electrode 495*b*, and the second dam 480*b* can be formed.

As described above, in the display device according to the fourth embodiment of the present disclosure, the first electrode 495*a* for forming the first dam 480*a* and the second electrode 495*b* for forming the second dam 480*b* can be separately provided to form the dam 480, such that the dam 480 can be more precisely formed, and the size of the bezel area can be reduced.

Meanwhile, according to the fourth embodiment of the present disclosure, the first dam 480*a* and the second dam 480*b* can be simultaneously formed, for example. In this case, because the (−) voltage is applied to the electric field application nozzle for forming the first dam 480*a*, the (+) voltage can be applied to the first electrode 495*a*, and the dam-forming material can be discharged onto the first electrode 495*a*, such that the first dam 480*a* can be formed. Further, because the (+) voltage is applied to another electric field application nozzle for forming the second dam 480*b*, the (−) voltage can be applied to the second electrode 495*b*, and the dam-forming material can be discharged onto the second electrode 495*b*, such that the second dam 480*b* can be simultaneously formed.

In addition, in the display device of the fourth embodiment of the present disclosure, the first dam 480*a*, which is disposed to surround the display area AA, contains a dam-forming material having a higher bonding force than a dam-forming material of the second dam 480*b*, and the second dam 480*b* contains a material having a higher moisture penetration inhibition characteristics than a dam-forming material of the first dam 480*a*. Therefore, it is possible to improve the reliability of the display device by suppressing the degradation of the light-emitting element.

As described above, the side surfaces of the first and second electrodes 495*a* and 495*b*, from which the pads are removed by the scribing process, can be exposed. For example, at one side of the substrate 301, one end of the first electrode 495*a* and one end of the second electrode 495*b* can be exposed.

Meanwhile, in the present disclosure described above, a third dam for blocking oxygen can be additionally provided in addition to the first dam 480*a* and the second dam 480*b*. In this case, it is possible to minimize the penetration of outside moisture and oxygen into the display device in the state in which the bonding force is increased. In this case, for example, a third electrode for forming the third dam can be further provided in addition to the first electrode 495*a* and the second electrode 495*b*. The third electrode can be disposed to overlap the third dam.

In addition, in this case, the first electrode 495*a*, the second electrode 495*b*, and the third electrode can alternately operate at the time of forming the first dam 480*a*, the second dam 480*b*, and the third dam. More specifically, as described above, because the (−) voltage is applied to the electric field application nozzle at the time of forming the first dam 480*a*, the (+) voltage can be applied to the first electrode 495*a*, and the (−) voltage is applied to the second electrode 495*b* and the third electrode, such that the dam-forming material can be discharged onto the first electrode 495*a*, and the first dam 480*a* can be formed. In contrast, because the (−) voltage is applied to the electric field application nozzle at the time of forming the second dam 480*b*, the (−) voltage can be applied to the first electrode 495*a* and the third electrode, and the (+) voltage can be applied to the second electrode 495*b*, such that the dam-forming material can be discharged onto the second electrode 495*b*, and the second dam 480*b* can be formed. In addition, because the (−) voltage is applied to the electric field application nozzle at the time of forming the third dam, the (−) voltage can be applied to the first electrode 495*a* and the second electrode 495*b*, and the (+) voltage can be applied to the third electrode, such that the dam-forming material can be discharged onto the third electrode, such that the third dam can be formed.

Meanwhile, according to the fourth embodiment of the present disclosure, the first dam 480*a*, the second dam 480*b*, and the third dam can be simultaneously formed, for example. In this case, because the (−) voltage is applied to the electric field application nozzle for forming the first dam 480*a*, the (+) voltage can be applied to the first electrode 495*a*, and the dam-forming material can be discharged onto the first electrode 495*a*, such that the first dam 480*a* can be formed. Further, because the (+) voltage is applied to another electric field application nozzle for forming the second dam 480*b*, the (−) voltage can be applied to the second electrode 495*b*, and the dam-forming material can be discharged onto the second electrode 495*b*, such that the second dam 480*b* can be simultaneously formed. In addition, because the (−) voltage is applied to still another electric field application nozzle for forming the third dam, the (+) voltage can be applied to the third electrode, and the dam-forming material can be discharged onto the third electrode, such that the third dam can be simultaneously formed.

In addition, for example, the third dam can be disposed outside the second dam 480*b* and surround the first dam 480*a*, the second dam 480*b*, and the display area AA. For example, the third dam can be disposed outside the non-display area NA.

The third dam may not overlap the capping layer 155, the planarization layer 105, and the GIP part 116.

For example, the third dam can be made of resin that blocks the penetration of oxygen.

That is, for example, the third dam can include a cross-linker that is contained in polar polymer, such as acrylic, to improve film density.

Figure 8:
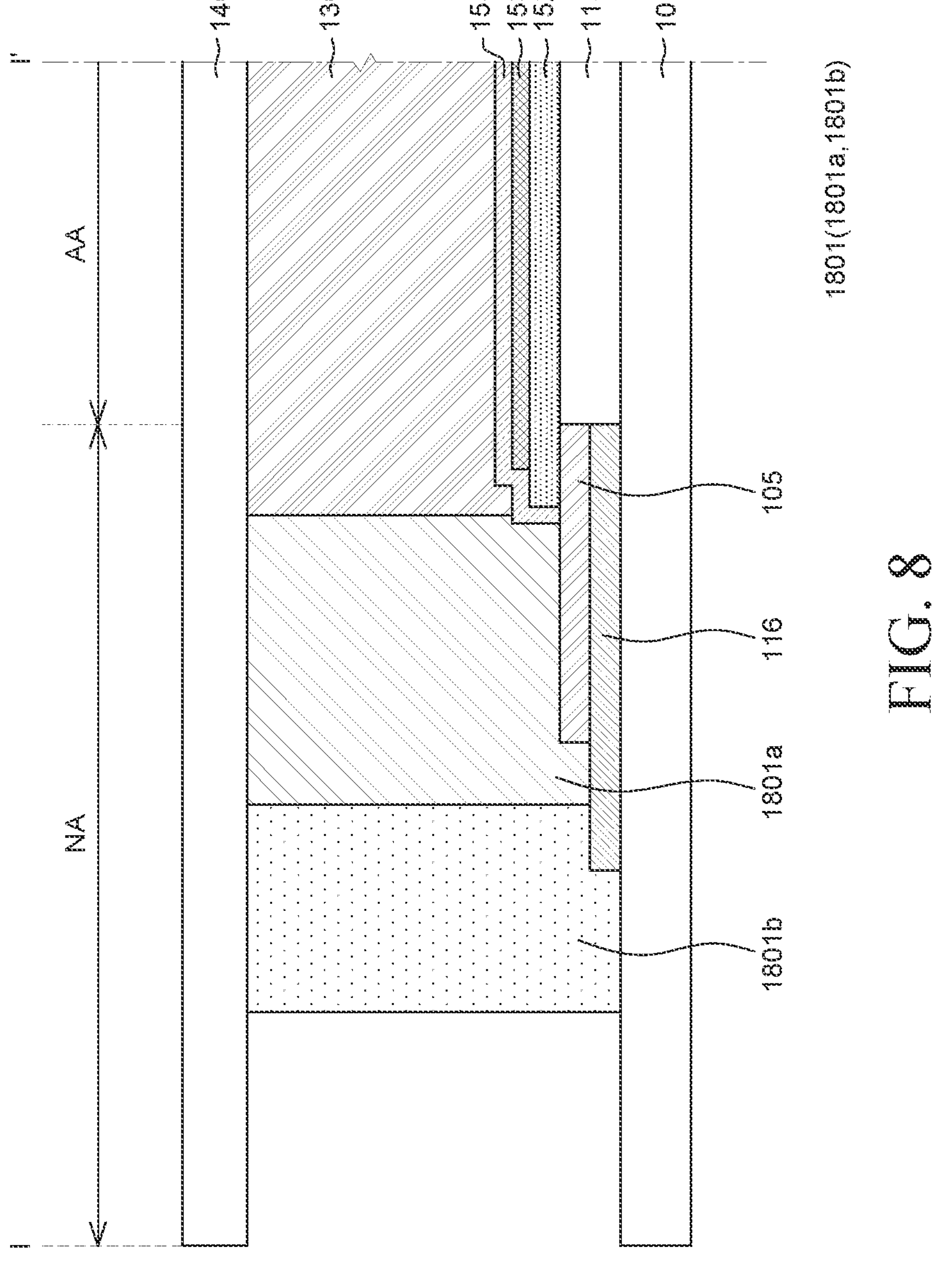
FIG. 8 is a cross-sectional view of the display device taken along line I-I' in FIG. 1 according to a fifth embodiment of the present disclosure.

FIG. 8 is a cross-sectional view of the display device taken along line I-I' in FIG. 1 according to a fifth embodiment of the present disclosure.

Since configurations of a display device of FIG. 8 according to the fifth embodiment of the present disclosure is substantially identical to that of the display device 100 in FIG. 3 with only differences in configurations of dams 1801*a* and 1801*b*, redundant descriptions will be omitted. The same reference numerals will be used for the same components. Hereinafter, a description of the same reference numerals can be made with reference to FIG. 3.

Referring to FIG. 8, the dam 1801 can include a first dam 1801*a* disposed adjacent to the display area AA, and a second dam 1801*b* disposed outside the first dam 1801*a* and configured to surround or be adjacent to the first dam 1801*a*. Based on a size or a width of a bezel area or the non-display area NA, sizes or widths of the dam 1801 or the first dam 1801*a* and the second dam 1801*b* can be adjusted. For example, as shown in FIG. 8, a width of the first dam 1801*a* and a width of the second dam 1801*b* can be different. In various embodiment of the present disclosure, the width of the second dam 1801*b* can be greater than the width of the first dam 1801*a*, but embodiments of the present disclosure are not limited thereto. For example, in other embodiment of the present disclosure, the width of the second dam 1801*b* can be less than the width of the first dam 1801*a*, or the width of the second dam 1801*b* can be approximately the same as the width of the first dam 1801*a*. Accordingly, as shown in FIG. 8, an outermost dam can have a width that is smallest among constituent dams of the dam 1801. But embodiments of the present disclosure are not limited thereto. For example to enhance a function or a characteristic of the constituent dam 1801, a thickness of each specific dam can be thicker or bigger than a dam without such function or characteristics.

Also, with reference to FIG. 8, a lower surface of the first dam 1801*a* can be disposed to overlap the planarization layer 105 and the GIP part 116, so that the lower surface of the first dam 1801*a* need not directly contact the substrate 101. Meanwhile, the second dam 1801*b* for increasing the bonding force between the substrate 101 and the encapsulation substrate 140 is provided outward, and can contact both the substrate 101 and the encapsulation substrate 140. The contact of the second dam 1801*b* with the substrate 101 or the encapsulation substrate 140 need not be a complete contact by upper and lower surfaces of the second dam 1801*b*. For example, a part of the lower surface of the second dam 1801*b* can contact the substrate 101, and a remainder of the lower surface of the second dam 1801*b* can contact the GIP part 116. But embodiments of the present disclosure are not limited thereto.

Figure 9:
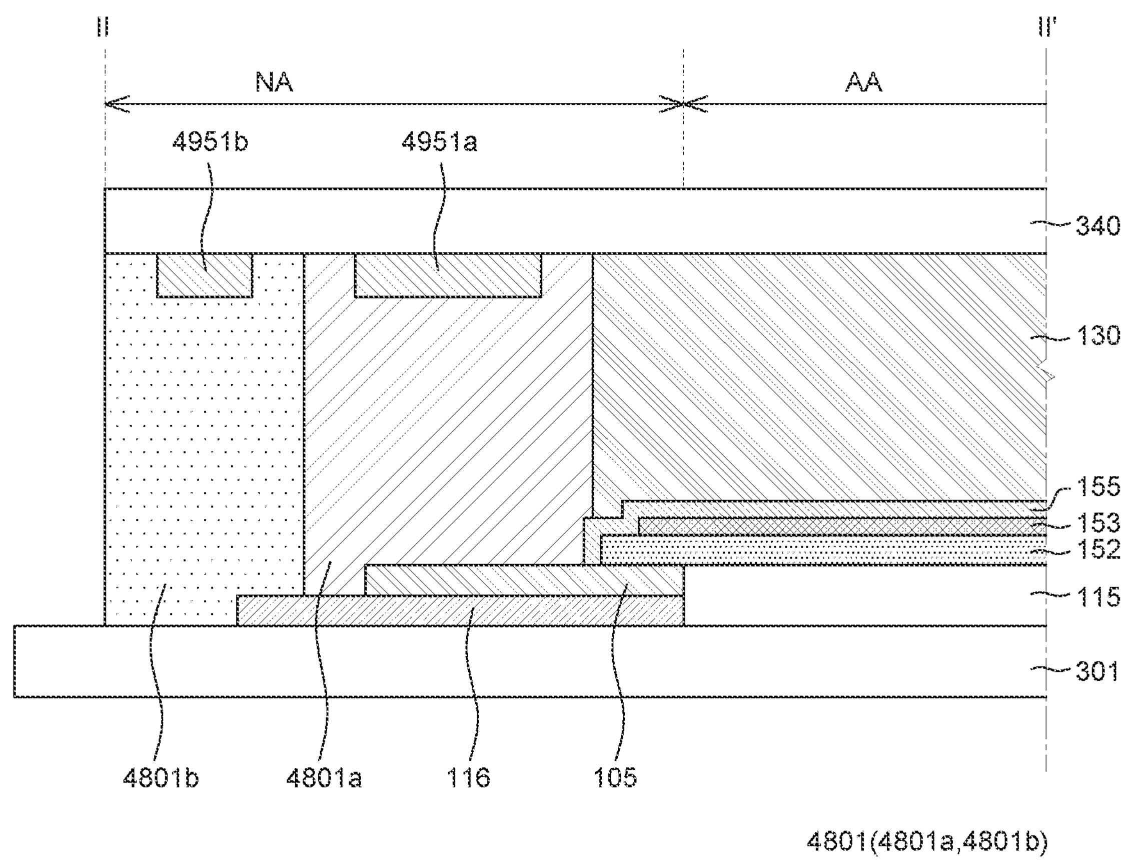
FIG. 9 is s a cross-sectional view of a display device according to a sixth embodiment of the present disclosure.

FIG. 9 is s a cross-sectional view of a display device according to a sixth embodiment of the present disclosure. Since configurations of a display device of FIG. 9 according to the sixth embodiment of the present disclosure is substantially identical to that of the display device 300 in FIG. 5 with only differences in configurations of dams 4801*a* and 4801*b*, and electrodes 4951*a* and 4951*b*, redundant descriptions will be omitted. The same reference numerals will be used for the same components. Hereinafter, a description of the same reference numerals can be made with reference to FIG. 5.

Referring to FIG. 9, the dam 4801 can include a first dam 4801*a* disposed adjacent to the display area AA, and a second dam 4801*b* disposed outside the first dam 4801*a* and configured to surround or be adjacent to the first dam 4801*a*. Based on a size or a width of a bezel area or the non-display area NA, sizes or widths of the dam 4801 or the first dam 4801*a* and the second dam 4801*b* can be adjusted. For example, as shown in FIG. 9, a width of the first dam 4801*a* and a width of the second dam 4801*b* can be different.

Additionally, sizes or widths of the electrodes 4951*a* and 4951*b* can be different. For example, with reference to FIG. 9, the size or the width of the second electrode 4951*b* can be smaller than the size or the width of the first electrode 4951*a*. Based on the different sizes of the first electrode 4951*a* and the second electrode 4951*b*, widths of corresponding first dam 4801*a* and second dam 4801*b* can be adjusted. Accordingly, the size of the bezel area or the non-display area can be adjusted to be narrower. In various embodiment of the present disclosure, the width of the second electrode 4951*b* can be less than the width of the first electrode 4951*a*, but embodiments of the present disclosure are not limited thereto. For example, in other embodiment of the present disclosure, the width of the second electrode 4951*b* can be greater than the width of the first electrode 4951*a*, or the width of the second electrode 4951*b* can be approximately the same as the width of the first electrode 4951*a*. Accordingly, as shown in FIG. 9, an outermost electrode can have a width that is smallest among constituent electrodes.

In various embodiments of the present disclosure, the dams can each includes a first surface that faces towards the adhesive film 130, and a second surface that faces towards an exterior of the display device 100. In this context, the first surface and the second surface can be not parallel to each other. For example, the first surface can be slanted in a cross-sectional view, or the first surface can be concave or convex. Accordingly, each dam can have a first surface that changes in a height or thickness direction in the cross-sectional view. Accordingly, in each of the dams, a slope of the second surface can be different from a slope of the first surface.

The exemplary embodiments of the present disclosure can also be described as follows:

According to an aspect of the present disclosure, there is provided a display device. The display device comprises a substrate including a display area, and a non-display area configured to surround the display area, an encapsulation substrate disposed on the substrate, a bonding film disposed between the substrate and the encapsulation substrate and a plurality of dams disposed between the substrate and the encapsulation substrate and configured to surround the bonding film, the plurality of dams can comprise a first dam disposed adjacent to the display area and made of epoxy-based resin and a second dam disposed outside the first dam and made of urethane-based resin.

A side surface of the first dam can contact a side surface of the second dam.

The first dam can include epoxy-based resin as a base material and includes a getter as a moisture-absorbing material.

The second dam can be made of a base material including urethane-based resin without including a getter.

The display device can further include a GIP part provided in the non-display area and disposed on the substrate, the plurality of dams can overlap the GIP part.

The display device can further include a planarization layer extending to the non-display area to cover a part of the GIP part, the first dam can overlap the planarization layer.

The display device can further include a capping layer extending to the non-display area to cover a part of the planarization layer, the first dam can overlap the capping layer.

The display device can further include a third dam disposed outside the second dam and made of polar polymer.

The third dam can include acrylic as the polar polymer and further includes a crosslinker.

The display device can further include a first alignment key disposed between the third dam and the substrate and configured to overlap the third dam.

The display device can further include a first alignment key disposed between the second dam and the substrate and configured to overlap the second dam.

A top surface of the first alignment key can contact a bottom surface of the second dam, and a bottom surface of the first alignment key can contact a top surface of the substrate.

A side surface of the second dam and a side surface of the first alignment key can be disposed on the same plane.

A side surface of the substrate and a side surface of the encapsulation substrate can be disposed on the same plane as a side surface of the second dam and a side surface of the first alignment key.

The display device can further include electrodes disposed on a bottom surface of the encapsulation substrate that overlaps the plurality of dams.

The electrodes can comprise a first electrode disposed to overlap the first dam and a second electrode disposed to overlap the second dam.

The first electrode and the second electrode can respectively receive voltages with different polarities at the time of forming the first and second dams.

At least one of the first electrode and the second electrode can be exposed at one side of the substrate.

The display device can further include a third dam disposed outside the second dam and made of polar polymer, the electrodes can comprise a first electrode disposed to overlap the first dam, a second electrode disposed to overlap the second dam and a third electrode disposed to overlap the third dam.

A side surface of the third dam can be disposed on the same plane as a side surface of the substrate and a side surface of the encapsulation substrate.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:

a substrate including a display area, and a non-display area adjacent to the display area;

an encapsulation substrate disposed on the substrate; and a plurality of dams disposed between the substrate and the encapsulation substrate, wherein the plurality of dams comprises:

a first dam disposed in the non-display area and including an epoxy-based resin;

a second dam disposed outside the first dam and including a urethane-based resin; and a third dam disposed outside the second dam and including a polar polymer, and wherein an alignment key disposed between the third dam and the substrate, and configured to overlap the third dam.

2. The display device of claim 1, wherein a side surface of the first dam contacts a side surface of the second dam.

3. The display device of claim 1, wherein the first dam includes the epoxy-based resin as a base material and further includes a getter as a moisture-absorbing material.

4. The display device of claim 1, further comprising:

a gate drive circuit provided in the non-display area and disposed on the substrate, wherein the plurality of dams overlap the gate drive circuit.

5. The display device of claim 4, further comprising:

a planarization layer extending to the non-display area to cover a part of the gate drive circuit, wherein the first dam overlaps the planarization layer.

6. The display device of claim 5, further comprising:

a capping layer extending to the non-display area to cover a part of the planarization layer, wherein the first dam overlaps the capping layer.

7. The display device of claim 1, wherein the third dam includes acrylic as the polar polymer and further includes a crosslinker.

8. The display device of claim 1, further comprising:

another alignment key disposed between the second dam and the substrate, and configured to overlap the second dam.

9. The display device of claim 8, wherein a side surface of the another alignment key is disposed on a same plane of at least one of a side surface of the second dam, a side surface of the substrate and a side surface of the encapsulation substrate.

10. The display device of claim 1, wherein a side surface of the alignment key is disposed on a same plane of at least one of a side surface of the third dam, a side surface of the substrate and a side surface of the encapsulation substrate.

11. The display device of claim 1, further comprising:

at least one electrode disposed on a bottom surface of the encapsulation substrate, and overlapping at least one of the plurality of dams.

12. The display device of claim 1, further comprising:

a first electrode disposed to overlap the first dam; and a second electrode disposed to overlap the second dam.

13. The display device of claim 12, wherein at least one of the first electrode and the second electrode is exposed at one side of the substrate.

14. The display device of claim 1, further comprising:

a first electrode disposed to overlap the first dam;

a second electrode disposed to overlap the second dam; and a third electrode disposed to overlap the third dam.

15. A display device comprising:

a substrate including a display area, and a non-display area adjacent to the display area;

an encapsulation substrate disposed on the substrate; and a plurality of dams disposed between the substrate and the encapsulation substrate, wherein the plurality of dams comprises:

a first dam disposed in the non-display area and having a first width;

a second dam having a second width;

a third dam having a third width, wherein a total width of the plurality of dams is equal to or less than a width of a bezel area or the non-display area of the display device, and wherein the display device further includes:

a first electrode having a first width, and overlapping the first dam;

a second electrode having a second width, and overlapping the second dam; and a third electrode having a third width, and overlapping the third dam.

16. The display device of claim 15, wherein the second width is different from the first width.

17. The display device of claim 15, wherein the first dam is adjacent to the display area, and includes an epoxy-based resin, and wherein the second dam is disposed outside the first dam and includes a urethane-based resin.

18. The display device of claim 15, further comprising at least one electrode on the encapsulation substrate, and disposed to overlap at least one of the first dam and the second dam.

19. The display device of claim 15, wherein the first electrode and the second electrode have different widths.

* * * * *